(12) United States Patent
Perthold

(10) Patent No.: US 9,007,251 B2
(45) Date of Patent: Apr. 14, 2015

(54) APPARATUS AND METHOD FOR CONVERTING AN ANALOG TIME DOMAIN SIGNAL INTO A DIGITAL FREQUENCY DOMAIN SIGNAL, AND APPARATUS AND METHOD FOR CONVERTING AN ANALOG TIME DOMAIN SIGNAL INTO A DIGITAL TIME DOMAIN SIGNAL

(71) Applicant: Innovationszentrum fuer Telekommunikationstechnik GmbH IZT, Erlangen (DE)

(72) Inventor: Rainer Perthold, Weisendorf (DE)

(73) Assignee: Innovationszentrum fuer Telekommunikationstechnik GmbH IZT, Erlangen (DE)

( * ) Notice: Subject to any disclaimer, the term of this patent is extended or adjusted under 35 U.S.C. 154(b) by 268 days.

(21) Appl. No.: 13/629,220

(22) Filed: Sep. 27, 2012

(65) Prior Publication Data
US 2013/0039451 A1    Feb. 14, 2013

Related U.S. Application Data

(63) Continuation of application No. PCT/EP2010/054330, filed on Mar. 31, 2010.

(51) Int. Cl.
H03M 1/12     (2006.01)
H03M 1/06     (2006.01)
G01R 23/16    (2006.01)

(52) U.S. Cl.
CPC ............. H03M 1/0678 (2013.01); G01R 23/16 (2013.01); H03M 1/121 (2013.01)

(58) Field of Classification Search
CPC ..... H03M 1/0678; H03M 1/121; G01R 23/16
USPC .......................... 341/155, 157, 118, 120, 159
See application file for complete search history.

(56) References Cited

U.S. PATENT DOCUMENTS

| 4,628,530 | A  | * | 12/1986 | Op De Beek et al. | ........ | 381/103 |
| 6,384,756 | B1 | * | 5/2002  | Tajiri et al.     | .......... | 341/120 |
| 8,000,047 | B2 | * | 8/2011  | Takahashi et al.  | ............ | 360/39  |
| 2005/0270213 | A1 |   | 12/2005 | Asami et al. | | |
| 2007/0254616 | A1 | * | 11/2007 | Gorin et al. | .................. | 455/323 |

* cited by examiner

Primary Examiner — Peguy Jean Pierre
(74) Attorney, Agent, or Firm — Michael A. Glenn; Perkins Coie LLP

(57) ABSTRACT

An apparatus for converting an analog signal into a digital signal includes: two identical analog-to-digital-converters converting the analog signal into first and second digital time domain signals; first and second transformation units transforming the first and second digital time domain signals into first and second digital frequency domain signals; a frequency compensation unit modifying the second frequency signal to reduce a difference between wanted signal components of the second and first frequency values caused by a difference between frequency responses of the analog-to-digital converters; a comparison unit determining for a same frequency bin corresponding first and second energy values associated to corresponding frequency values of the first and second digital frequency domain signal, and determining a minimum energy value thereof; and a selection unit selecting for a same frequency bin of the digital frequency domain signal the digital frequency domain signal associated to the minimum energy value.

17 Claims, 8 Drawing Sheets

APPARATUS AND METHOD FOR CONVERTING AN ANALOG TIME DOMAIN SIGNAL INTO A DIGITAL FREQUENCY DOMAIN SIGNAL, AND APPARATUS AND METHOD FOR CONVERTING AN ANALOG TIME DOMAIN SIGNAL INTO A DIGITAL TIME DOMAIN SIGNAL

CROSS-REFERENCE TO RELATED APPLICATIONS

This application is a continuation of copending International Application No. PCT/EP2010/054330, filed Mar. 31, 2010, which is incorporated herein by reference in its entirety.

The present invention relates to apparatus and methods for converting analog time domain signals into digital frequency domain or time domain signals, for example apparatus and methods using analog-to-digital-converters (ADC).

BACKGROUND OF THE INVENTION

Analog-to-digital-converters provide the interface between the analog world and the digital world. Analog-to-digital-converters are used, for example, in communication receivers for converting received analog signals into corresponding digital signals. When converting the analog signals, analog-to-digital-converters map analog signal values to corresponding digital signal values. Their resolution depends on the number of bits they can encode the analog signal. For example, an 8 bit analog-to-digital-converter can map the analog values to 256 different digital signal levels. However, analog-to-digital-converters are not ideal and usually suffer from at least small nonlinearities. If, for example, the analog-to-digital-converter is fed with a deterministic signal, for example, one or multiple sine waves, these nonlinearities create intermodulation products and images of the actual or wanted signals, for example at the clock frequency or multiples of the clock frequency of the analog-to-digital-converter and/or frequencies of mixed products of the clock frequency and the wanted signal. These unwanted signals are also referred to as spurious signals and superimpose the wanted signals. Especially at lower input levels, these spurious signal can be quite disturbing as they do not decrease with the input power as analog intermodulation products would.

It is state of the art to apply a dither signal to the input of the analog-to-digital-converter in a frequency range that lies outside the frequency range of the wanted signals, so that it can be suppressed by digital processing after the analog-to-digital-conversion. Dithering usually works well up to approximately −20 dBfs (fs=full scale) of the analog-to-digital-converter. If the wanted signals have higher power, the power of the dither has to be increased as well. This is also referred to as "large signal dither". However, large signal dither can have negative side effects, for example a reduced input range for the wanted signals, as the dither signal itself adds substantial power (this may also make the automatic gain control of a receiver more difficult), and degradation of the wanted signal due to intermodulation with the dither signals.

In addition to the spurious signals, the analog-to-digital-converters typically also add noise to the signal, for example thermal noise.

Therefore, there is a need for reducing spurious signals and/or noise in devices and methods using analog-to-digital-converters.

SUMMARY

According to an embodiment, an apparatus for converting an analog time domain signal into a digital frequency domain signal is provided may have: a first analog-to-digital-converter adapted to receive the analog time domain signal and to convert the analog time domain signal into a first digital time domain signal according to a first frequency response; a second analog-to-digital-converter identical in construction to the first analog-to-digital-converter, wherein the second analog-to-digital-converter is adapted to receive the analog time domain signal and to convert the analog time domain signal into a second digital time domain signal according to a second frequency response, the second frequency response differing from the first frequency response; a first transformation unit adapted to transform the first digital time domain signal into a first digital frequency domain signal, wherein the first digital frequency domain signal includes for a frequency bin k of the first digital frequency domain signal a corresponding first frequency value, wherein the first frequency value has a first wanted signal component, a first spurious signal component and/or a first noise component, the first spurious signal component and/or the first noise component at least partially being caused by the first analog-to-digital-converter; a second transformation unit adapted to transform the second digital time domain signal into a second frequency domain signal, wherein the second digital frequency domain signal includes for a same frequency bin k of the second digital frequency domain signal a corresponding second frequency value, wherein the second frequency value has a second wanted signal component, a second spurious signal component and/or a second noise component, wherein the second spurious signal component and/or the second noise component are at least partially caused by the second analog-to-digital-converter, and wherein the second spurious signal component differs from the first spurious signal component and/or the second noise component differs from the first noise component; a frequency compensation unit adapted to modify the second frequency signal so as to reduce a difference between the second wanted signal component of the second frequency value and the first wanted signal component of the first frequency value caused at least partially by the difference between the second frequency response and the first frequency response; a comparison unit adapted to determine for the same frequency bin k a corresponding first energy value associated to the first frequency value and a corresponding second energy value associated to the second frequency value, to compare the first energy value and the second energy value, and to determine a minimum energy value thereof; and a selection unit adapted to select for a same bin (k) of the digital frequency domain signal of the apparatus the corresponding first frequency value in case the corresponding first energy value is the minimum energy value, or the corresponding second frequency value in case the corresponding second energy value is the minimum energy value.

According to another embodiment, an apparatus for converting an analog time domain signal into a digital time domain signal is provided may have: an apparatus for converting an analog time domain signal into a digital frequency domain signal according to the first aspect; and an inverse transformation unit adapted to transform the digital frequency domain signal into the digital time domain signal.

According to another embodiment, a method for converting an analog time domain signal into a digital frequency domain signal is provided may have the steps of: receiving the analog time domain signal; converting the analog time domain signal into a first digital time domain signal by a first analog-to-digital-converter according to a first frequency response; converting the analog time domain signal into a second digital time domain signal by a second analog-to-digital-converter identical in construction to the first analogto-digital-converter according to a second frequency response, the second frequency response differing from the first frequency response; transforming the first digital time domain signal into a first digital frequency domain signal, wherein the first digital frequency domain signal includes for a frequency bin k of the first digital frequency domain signal a corresponding first frequency value, wherein the first frequency value has a first wanted signal component, a first spurious signal component and/or a first noise component, the first spurious signal component and/or the first noise component at least partially being caused by the first analog-to-digital-converter; transforming the second digital time domain signal into a second frequency domain signal, wherein the second digital frequency domain signal includes for the same frequency bin k of the second digital frequency domain signal a corresponding second frequency value, wherein the second frequency value has a second wanted signal component, a second spurious signal component and/or a second noise component, wherein the second spurious signal component and/or the second noise component are at least partially caused by the second analog-to-digital-converter, and wherein the second spurious signal component differs from the first spurious signal component and/or the second noise component differs from the first noise component; modifying the second frequency signal so as to reduce a difference between the second wanted signal component of the second frequency value and the first wanted signal component of the first frequency value caused at least partially by the difference between the second frequency response and the first frequency response; determining for the same frequency bin k a corresponding first energy value associated to the first digital frequency value and a corresponding second energy value associated to the second frequency value; comparing the first energy value and the second energy value to determine a minimum energy value thereof; and selecting for the same bin k of the digital frequency domain signal of the apparatus the corresponding first frequency value in case the corresponding first energy value is the minimum energy value, or the corresponding second frequency value in case the corresponding second energy value is the minimum energy value.

According to another embodiment, a method for converting an analog time domain signal into a digital time domain signal is provided may have the steps of a method for converting an analog time domain signal into a digital time domain signal according to the third aspect, and inverse transforming the digital frequency domain signal into the digital time domain signal.

Another embodiment may have a computer program having a program code for performing a method in accordance with claim 15 or 16, when the program runs on a computer.

Embodiments of the present invention efficiently exploit that (a) spurious signals can be easily detected in the spectral domain, (b) spurious signals usually differ in power between multiple analog-to-digital-converters fed with the same input signal, and (c) internally (internal with regard to the analog-to-digital-converter) generated noise, for example thermal noise, is uncorrelated between different or multiple analog-to-digital-converters.

Embodiments of the present invention use—instead of a single analog-to-digital-converter—two (or more) analog-to-digital-converters that are identical in construction, i.e. comprise essentially the same components connected essentially in the same way to each other to provide essentially the same functionality and show essentially the same technical characteristics, i.e. similar frequency responses. However, due to production differences, the two (or more) analog-to-digital-converters do not have exactly the same characteristics and frequency response, nor do they generate the same spurious signals when the same wanted signal is applied to the two (or more) analog-to-digital-converters. To compensate the difference between the frequency response, i.e. the differences in magnitude, phase and group delay of the two (or more) converted digital signals originating from the same analog signal, a compensation unit is added to the second (or further) signal path comprising the second (further) analog-to-digital-converter. The compensation unit modifies the second (further) digital time domain signal and/or the second (further) digital frequency domain signal so as to at least reduce at least the differences of the first digital wanted signal and the second (further) digital wanted signal in magnitude, phase and delay, and prefereably compensates the differenes, i.e. reduces the differences to such an extent that they are negligible.

In other words, the first analog-to-digital-converter is adapted to convert the wanted analog time domain signal input to the first analog-to-digital-converter into a first digital time domain signal comprising a digital wanted signal component, a digital spurious signal component and a digital noise component. The second (and every further) analog-to-digital-converter is adapted to convert the same wanted analog time domain signal to a second (further) digital time domain signal comprising a second (further) digital wanted signal component, a second (further) spurious digital signal component and a second (further) digital noise component. According to the invention, a frequency response compensation is applied to the second (further) digital signal, in the time domain or in the frequency domain, typically complex frequency domain, to adapt the second (further) signal in magnitude, phase and delay to the first digital signal such that the difference between the two signals is negligible, i.e. the difference in magnitude, phase and delay between the two (or more) signals in the time domain and/or frequency domain is negligible.

Due to the compensation of the differences in the frequency response of the two (or more) analog-to-digital-converters, the magnitudes and phases of the typically complex frequency values of the first frequency signal and the second frequency signal are identical or at least almost identical, so that the minimum energy decision and the corresponding selection of the frequency value with the smaller respectively smallest power only causes minor or negligible losses in signal power compared to the frequency value having the higher or highest energy value of the two (or more) frequency values. However, because the compensation of the two (or more) frequency responses does not compensate the differences of the spurious components of the two (or more) different digital frequency signals, or at least does not compensate the differences to the same absolute and relative extent (relative to the absolute power) as for the wanted signal components, and because the spurious signal components of the two (or more) different frequency domain signals are not correlated or only partially correlated, typically considerable differences remain between corresponding spurious signal components of the two (or more) digital frequency signals. By selecting the frequency value of the two (or more) different digital frequency signals having the smaller (or smallest) energy value, the ratio between the magnitude or power of the wanted signal and the magnitude or power to the spurious signal at the respective frequency is increased.

The reason for the improvement of the signal to noise ratio, i.e. the ratio between the magnitude or power of the wanted signal and the magnitude or power of the noise, is similar. The noise component of the first digital signal and the noise component of the second (or further) digital signal are stochastic processes and, therefore, uncorrelated. By selecting the frequency value with the smaller (or smallest) energy value, the distance or ratio between the wanted signal component and the noise component is increased.

Implementing more than two analog-to-digital-converters including the corresponding frequency compensation, the probability that a small or smaller spurious signal component or noise component is found for a specific frequency, is increased, and, thus, also the wanted signal to spurious signal ratio and the wanted signal to noise ratio.

Further embodiments comprise means units adapted to determine a mean value between the frequency values of the two (or more) typically complex frequency signals, and, thus, increase security. As the wanted signal components (after the frequency response compensation) show the same or very similar magnitudes and phases, the magnitude of the resulting complex frequency value determined by the vector sum or complex pointer sum of the two (or more) complex frequency values corresponds to or is almost similar to the sum of the magnitudes of the two (or more) complex wanted signal components. Thus, the mean value, for example the arithmetic mean value, of the wanted signal components is equal to or at least differs only to a negligible extent from the individual wanted signal components of the two (or more) different digital signals. However, as the spurious signal components of the two (or more) digital signals typically differ in magnitude and phase, the magnitude of the resulting complex sum value of the complex spurious signal components is typically considerably smaller than the sum of the magnitudes of the spurious signal components. In case the two (or more) frequency values have inverse phases or nearly inverse phases to each other, the two (or more) different spurious signal components may even fully cancel or at least partially cancel or extinct each other. In these cases, the mean value (the magnitude of the resulting complex value, i.e. the magnitude of the resulting sum pointer divided by the number of different frequency signals) may even be smaller than the magnitude of the smallest individual spurious signal component of the two (or more) different frequency values. Therefore, such embodiments can provide even further gains in the ratios between wanted signal components and spurious signal components and respectively wanted signal components and noise components.

Embodiments of the present invention can be adapted to determine the frequency value V(k) for the output signal of the apparatus for one frequency bin, for several frequency bins or for all frequency bins of the digital frequency domain signal V, i.e. to reduce the spurious signals and/or noise for one, several or all frequency bins.

Therefore, embodiments of the invention facilitate to reduce spurious signals and noise analog-to-digital-converter applications and to avoid the disadvantages of large signal dither.

Embodiments of the invention can be applied in any system, where analog-to-digital-conversion is performed and where it is desired to minimize noise and spurious signals caused by non-linearities mainly in the analog-to-digital-converters. Embodiments of the present invention are especially geared to wide band digital receivers, where the spurious free dynamic range (SFDR) has to be very good. However, embodiments of the present invention can be also equally applied to other applications, for example for radio frequency spectrum analysis.

BRIEF DESCRIPTION OF THE DRAWINGS

Embodiments of the present invention will be detailed subsequently referring to the appended drawings, in which.

DETAILED DESCRIPTION OF THE INVENTION

Figure 1A:
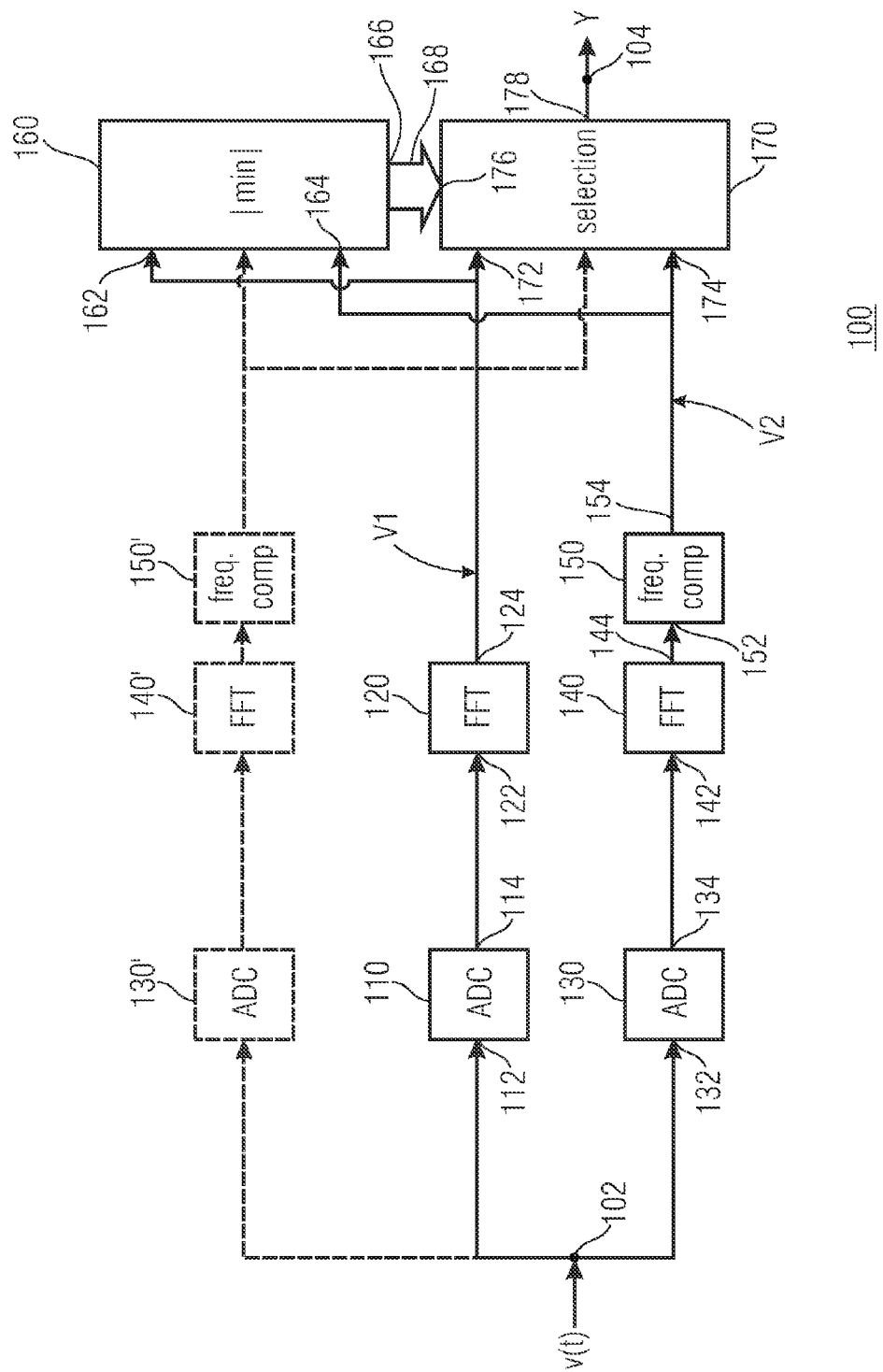
FIG. 1A shows a block diagram of a first embodiment of an apparatus for converting an analog time domain signal into a digital frequency domain signal.

Equal or equal elements are denoted in the following description of the figures by equal or equal reference numerals.

FIG. 1 shows a block diagram of a first embodiment of an apparatus 100 for converting an analog time domain signal v(t) into a digital frequency domain signal Y.

The apparatus 100 comprises an input port 102 for receiving the analog time domain signal and an output port 104 for outputting the digital frequency domain signal. The apparatus 100 further comprises a first analog-to-digital-converter (ADC) 110, a first transformation unit 120, a second analog-to-digital-converter 130, a second transformation unit 140, a frequency response compensation unit 150, a comparison unit 160 and a selection unit 170.

The first analog-to-digital-converter 110 comprises an input port 112 and an output port 114, the first transformation unit 120 comprises an input port 122 and an output port 124, the second analog-to-digital-converter comprises an input port 132 and an output port 134, the second transformation unit comprises an input port 142 and an output port 144, the frequency response compensation unit comprises an input port 152 and an output port 154, the comparison unit 160 comprises a first input port 162, a second input port 164 and an output port 166, and the selection unit 170 comprises a first input port 172, a second input port 174, a third input port 176 and an output port 178.

The input port 112 of the first analog-to-digital-converter is electrically coupled to the input port 102 (common input port) of the apparatus 100, the output port 114 of the analog-to-digital-converter 110 is connected to the input port 122 of the transformation unit 120, and the output port 124 of the transformation unit is electrically coupled to the first input port 162 of the comparison unit and to the first input port 172 of the selection unit. The first analog-to-digital-converter 110 and the first transformation unit 120 form a first signal path. The input port 132 of the second analog-to-digital-converter is electrically coupled to the input port 102 of the apparatus 100, the output port 134 of the second analog-to-digital-converter is electrically coupled to the input port 142 of the second transformation unit 140, the output port 144 of the second transformation unit 140 is electrically coupled to the input port 152 of the frequency response compensation unit and the output port 154 of the frequency response compensation unit 150 is coupled to the second input port 164 of the comparison unit 160 and to the second input port 174 of the selection unit 170. The second analog-to-digital-converter 130 and the second transformation unit 140 form a second signal path, wherein the second analog-to-digital-converter 130 and the second transformation unit 140 together with the frequency response compensation unit 150 form a compensated second signal path, as will be described later. The output port 166 of the comparison unit is electrically coupled to the third input port 176 of the selection unit 170, and the output port 178 of the selection unit is electrically coupled to or forms the output port 104 of the apparatus 100.

The first analog-to-digital-converter 110 is adapted to receive the analog time domain signal v(t) at its input port 112 and is adapted to convert the analog time domain signal into a digital time domain signal according a first frequency response, the first frequency response characterizing the transfer characteristics of the first analog-to-digital-converter 110, and to output the digital time domain signal by output port 114. The first transformation unit 120 is adapted to receive the first digital time domain signal and to transform the digital time domain signal into a digital frequency domain signal according to a first transformation algorithm, for example a Fast Fourier Transformation (FFT), and to output the first digital frequency domain signal V1 via output port 124. The first digital frequency domain signal V1 comprises a given number of frequency bins k or channels k and for each frequency bin k a respective frequency value V1(k), for example, a complex frequency value defined by its magnitude and its phase or by its imaginary and real part or component. The frequency values associated to the individual frequency bins can comprise wanted signal components, spurious signal components and/or noise components.

The second analog-to-digital-converter 130 is adapted to receive, for example, the same analog time domain signal v(t) as the first analog-to-digital-converter 110, via input port 132 and to convert the analog time domain signal into a second digital time domain signal according to a second frequency response, the second frequency response characterizing the transfer characteristics of the second analog-to-digital-converter 130, and to output the second digital time domain signal via outputport 134. The second transformation unit 140 is adapted to receive the second digital time domain signal and to transform the second digital time domain signal according to a second transformation algorithm, here a Fast Fourier Transformation, to generate a second digital frequency domain signal at the output port 144. In preferred embodiments the second transformation unit 140 is adapted to apply the same transformation algorithm like the first transformation unit 120, e.g. the same Fast Fourier Transformation. The second digital frequency domain signal comprises a given number (for example the same number as the first digital frequency domain signal V1) of frequency bins k and respective second frequency values V2(k), e.g. complex second frequency values, wherein the respective second frequency values may comprise wanted signal components, spurious signal components and/or noise components. In preferred embodiments, the second digital frequency domain signal comprises the same frequency bins k as the second digital frequency domain signal and, for example the same index k refers to the same frequency bin in both digital frequency domain signals.

The frequency reply compensation unit 250 is adapted to receive the second digital frequency domain signal via input port 152 and to modify the second digital frequency domain signal according to a corrective or compensation frequency response so as to reduce the difference between the second wanted signal components of the second digital frequency domain values V2(k) or second digital frequency domain signal V2 and the corresponding wanted signal components (wanted signal components of the same frequency) of the first digital frequency domain values V1(k) respectively the first digital frequency domain signal V1, and to output the corrected or compensated second digital frequency domain signal V2 and its corrected or compensated second digital frequency domain values V2(k) via the output port 154. For simplicity reasons, the corrected or compensated digital frequency domain signal V2 and the corresponding second frequency values v2(k) are also referred to as "second frequency domain signal V2" respectively "second frequency domain values V2(k)".

Preferably the frequency response compensation unit 150 is adapted to modify the second digital frequency domain signal such that the second wanted signal components of the second digital frequency domain signal essentially coincide to corresponding wanted signal components of the first digital frequency domain signal.

The first and second spurious signal components are particularly generated by the first analog-to-digital-converter 110 respectively the second analog digital converter 130 due to their specific individual nonlinearities, as explained previously.

As mentioned before, the second digital frequency domain signal V2 comprises, for example, the same frequency bins, i.e., the same number of frequency bins k and the same frequency ranges for each frequency bin, as the first digital frequency domain signal V1, and further comprises for each of the frequency bins a second complex frequency value V2(k), wherein the second complex frequency value can comprise second wanted signal components, second spurious components and/or second noise components. Due to the frequency response compensation, the second wanted signal components essentially coincede, e.g. with the first wanted signal components of the first digital frequency domain signal. Although the frequency response compensation 250 also modifies the second spurious signal components, the first and second spurious signal components also show after the frequency response compensation considerable differences (because the first and second spurious signal components are only partially correlated) that can be used for the inventive approach of the spurious signal reduction. The same applies for the first and second noise components. As the first and second noise components are not correlated between the two analog-to-digital-converters, the second noise components after the frequency response compensation 150 remain uncorrelated with the first noise components and, thus, typically considerable differences between the first and second noise components remain that can be used for the inventive approach of reducing the noise, as will be explained in more detail later.

The comparison unit 160 receives the first digital frequency domain signal V1 and the second digital frequency domain signal V2 and determines or estimates based on a frequency value, e.g. V1(k) respectively V2(k), for each frequency bin k of the first and the second digital frequency domain signal individually the corresponding energy values for each frequency bin and signal. In other words, the comparison unit determines for each first frequency value of the first digital frequency domain signal V1 a corresponding first energy value associated to the first frequency value of the same frequency bin k, and for each second frequency value of the second digital frequency domain signal V2 a corresponding second energy value associated to the second frequency value of the same frequency bin k.

For each frequency bin, the comparison unit 164, further, compares the corresponding first energy value of the first digital frequency domain signal V1 and the corresponding second energy value of the second digital frequency domain signal V2 and determines which of the two has the smaller value, i.e. is the minimum value. The comparison unit 160 is further adapted to generate a selection signal 168 and output the selection signal 168 via output port 166.

The selection signal 168 can, for example, comprise for each bin k, for example identified by the bin index k, a minimum indicator, for example "0" in case the first energy value of the first digital frequency domain signal is the minimum energy value, or "1" to indicate that the second energy value of the second digital frequency domain signal V2 has the smallest energy value.

The selection unit 170 is adapted to receive the selection signal 168 from the comparison unit 160, and to select based on the selection signal 168 the minimum frequency value, i.e. to select for each frequency bin (e.g. identified by the bin index) as frequency value V(k) of or for the digital frequency domain signal Y the first frequency value V1(k) of the first frequency domain signal in case the first energy value is the minimum value, and to select the second frequency value V2(k) of the second digital frequency domain signal V2 in case the second energy value is the minimum energy value.

In the following, the signal processing and selection method described in FIG. 1A will be explained in more detail based on FIGS. 1B-1D. FIG. 1B shows an exemplary first digital frequency domain signal V1, FIG. 1C shows an exemplary second digital frequency domain signal V2 (after compensation) and FIG. 1D shows an exemplary spurious signal reduced digital output frequency domain signal Y output by the selection unit 170. For simplicity reasons, the analog time domain signal is a sine wave signal with a frequency fw. The frequency bins k are depicted and referred to by "f" and a specific further index, e.g. "w" for the bin with the wanted signal component. Besides the wanted signal component W (respectively W1 for V1 and W2 for V2) at frequency bin fw, exemplary spurious signal components S an S' (respectively S1 and SP for V1 and S2 and S2' for V2) at different frequency bins fs and fs' are depicted, whereas the noise is not shown. The noise would, e.g., be distributed over the entire frequency spectrum. The FIGS. 1B-1D show the frequency values in form of a complex pointer diagram with f indicating the frequency (f-axis), R indicating the real part (R-axis) and I indicating the imaginary part (I-axis) of the complex frequency values.

As can be seen from FIG. 1B, the first digital frequency domain signal V1 comprises a frequency value W1 at frequency bin fw, a first spurious signal component S1 at frequency bin fs and a further first spurious signal component S1' at frequency bin fs'. All three frequency values, i.e. W, S1 and S1', are assumed to be real values in FIG. 1B.

FIG. 1C shows the second digital frequency signal V2 with the second wanted signal component W2 at frequency bin fw, a second spurious signal component S2 at frequency bin fs and a further second spurious signal component S2' at fs'. As can be seen from FIG. 1C, the second wanted signal value W2 is a real positive value, whereas the second spurious signal component S2 is an imaginary spurious signal component and the further second spurious signal component S2' has a negative real value. The magnitude of the frequency value or component W2 is almost equal to the first frequency value or component W1, however slightly smaller (e.g. the difference is negligibly small). The magnitude of the first spurious signal component S1 is smaller than the magnitude of the second spurious signal component S2, for example only half as large as the magnitude of the second spurious signal component S2. The magnitude of the further second spurious signal or frequency value S2' is smaller than the magnitude of the corresponding further first frequency value S1' of the first digital frequency domain signal W1.

Due to the frequency response compensation 150, the first and the second wanted signal component W1 and W2 do not only show equal or almost magnitudes but also equal or almost equal phases, i.e. in FIGS. 1B and 1C only comprise real components. On the other hand, as the first and second spurious signal components S1 and S2 on one hand and S1' and S2' on the other hand are not correlated, they may not only show different magnitudes but also different phases, as shown in FIGS. 1B and 1C.

Figure 1B:
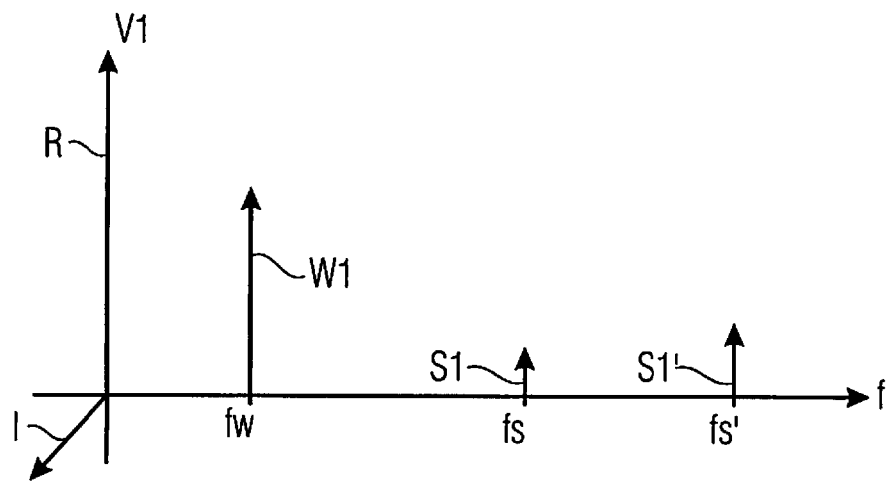
FIGS. 1B-1D show exemplarily a first and second digital frequency domain signals and the resulting digital frequency domain signal of the apparatus of FIG. 1A after the minimum selection.
Figure 1C:
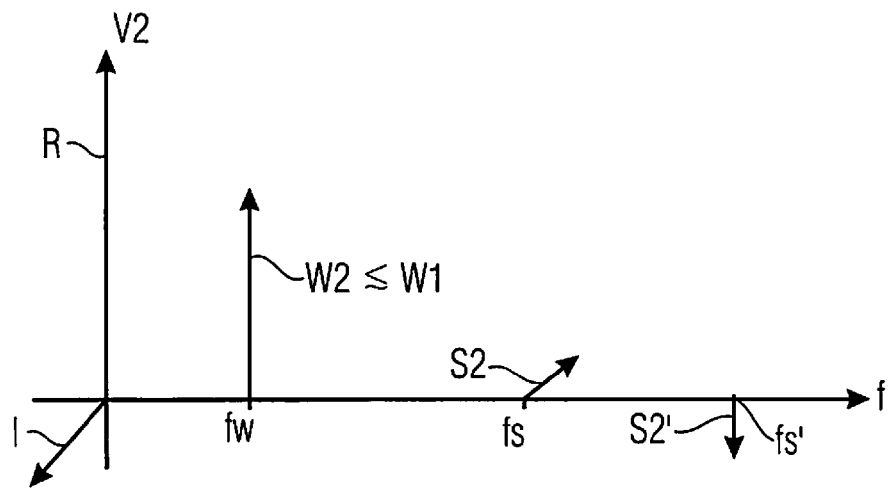
Figure 1D:
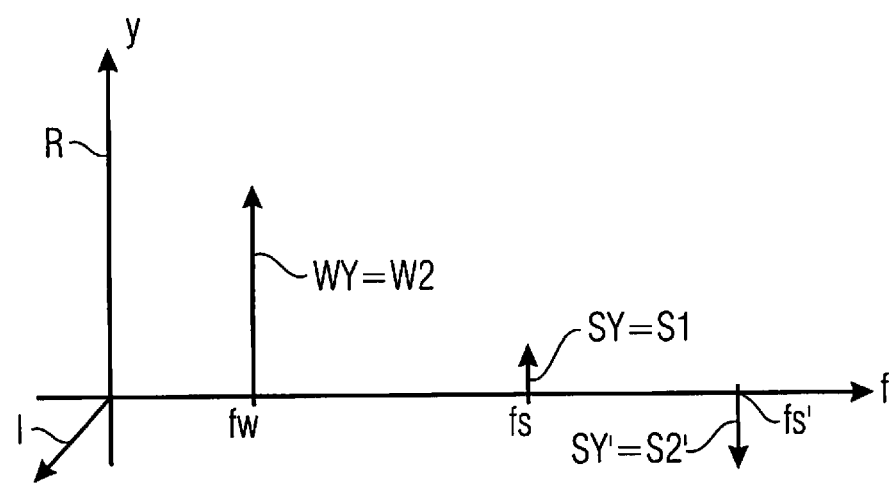

As explained based on FIG. 1A, the first and the second digital frequency signals V1 and V2 are fed into the comparison unit 160 which performs an energy estimation based on the frequency values. As the energy or power is proportional to the square of the magnitudes, i.e. Power~Magnitude², the energy value corresponding to the second frequency value W2 at bin fw is smaller than the first energy value corresponding to the first frequency value W2 at bin fw. Therefore, selection unit 170 will select the second frequency value V2(k=fw)=W2 as the output frequency value WY representing the frequency value Y(k=fw) of the output signal Y for frequency bin k=fw.

As the magnitude of the frequency value S1 is smaller than the magnitude of the second frequency value S2, also the first energy value corresponding to the first spurious signal component S1 is smaller than the second energy value corresponding to the second spurious signal component S2. Therefore, selection unit 170 will select the first frequency value, i.e. the first spurious signal component V1(k=fs)=S1, as output frequency value Y(k=fs) for the corresponding bin specified by frequency fs, i.e. k=fs, of the digital frequency domain signal Y.

As the magnitude of the further first frequency value S2' is smaller than the magnitude of the further first frequency value S1', also the second energy value corresponding to the further second spurious signal component S2' is smaller than the first energy value corresponding to the further first spurious signal component S1'. Therefore, selection unit 170 will select the further second frequency value, i.e. the second spurious signal component V2(k=fs')=S2', as output frequency value Y(k=fs') for the corresponding bin specified by frequency fs', i.e. k=fs', of the digital frequency domain signal Y.

Therefore, the output digital frequency signal Y comprises the second wanted signal component W2 as frequency value for frequency bin fw, the first spurious signal component S1 as the frequency value for the frequency bin specified by frequency fs and the second spurious signal component S2' as the frequency value for the frequency bin specified by frequency fs as as shown in FIG. 1D.

Due to the frequency response compensation, the difference between the magnitudes of the wanted signal components W1 and W2 is negligible. On the other hand, for the spurious signal, the minimum selection algorithm has the effect that for each of the corresponding frequency bins fs and fs', the frequency value of the smaller magnitude respectively smaller energy is selected. Thus, the spurious signal components have been reduced relative to the wanted signal components and the ratio of the wanted signal components to the spurious signal components has been improved.

Although not shown in FIGS. 1B-1D, the minimum energy decision and selection additionally has the effect that the noise value with the smaller energy is selected, and, thus, also the noise is reduced relative to the wanted signal components.

Figure 2A:
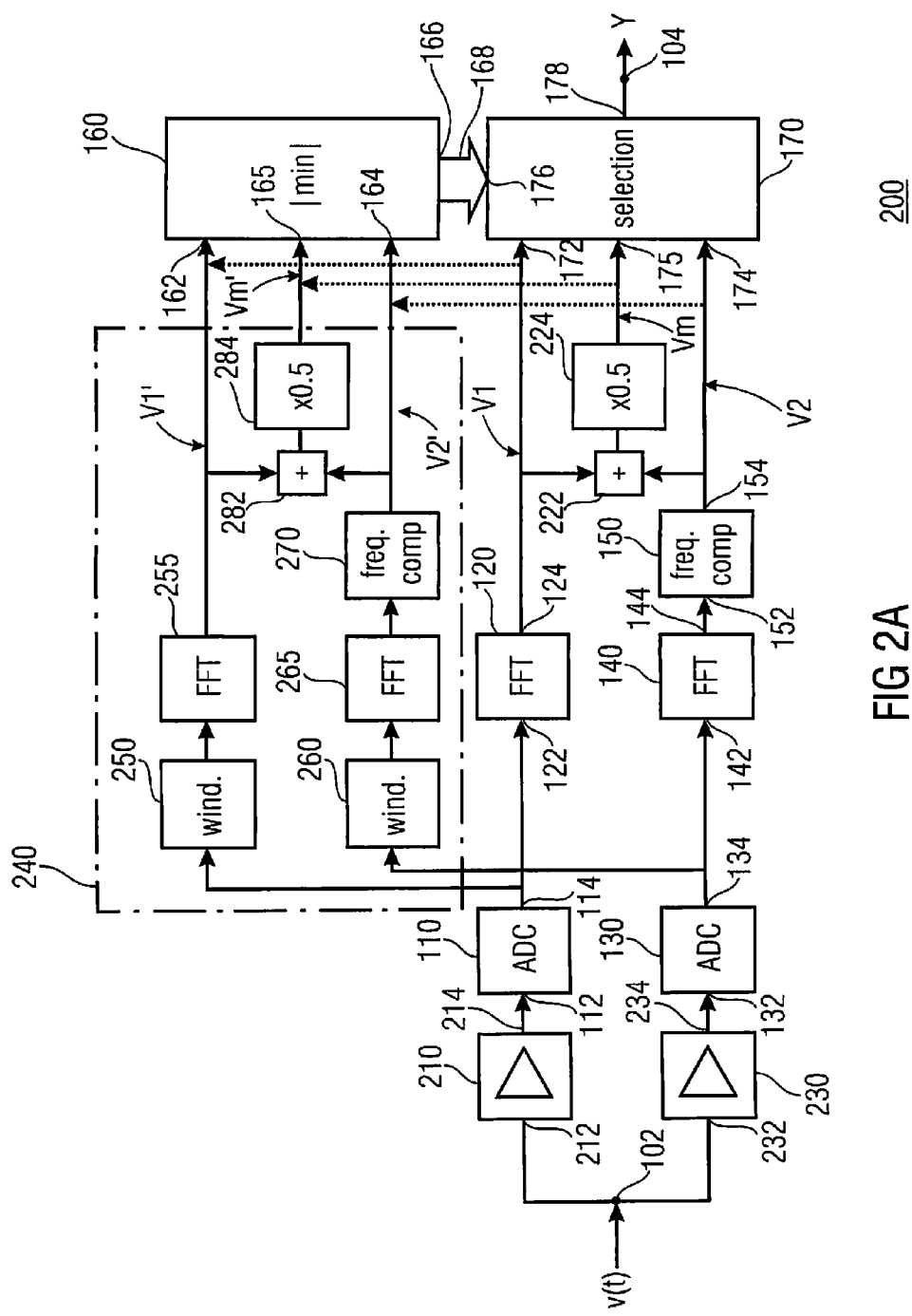
FIG. 2A shows a block diagram of a second and further embodiments of an apparatus for converting an analog time domain signal into a digital frequency domain signal comprising means units and/or a parallel preprocessing block for the energy determination.

FIG. 2A shows a block diagram of further embodiments of an apparatus for converting an analog time domain signal v(t)

into a digital frequency domain signal Y. The apparatus 200 according to FIG. 2A has—compared to apparatus 100 according to FIG. 1A—additional components or elements, namely a first amplifier 210, a second amplifier 230, a means unit, the means unit comprising an adder 222 and a divider 224, and—optionally—an energy estimation preprocessing block 240.

The first amplifier 210 comprises an input port 212 and an output port 214, the second amplifier 230 comprises an import port 232 and an output port 234. The input port 212 of the first amplifier and the input port 232 of the second amplifier 230 are electrically coupled to the input port 102 of the apparatus 200, the output port 214 of the first amplifier 210 is electrically coupled to the input port 112 of the first analog-to-digital-converter and the output port 234 of the second amplifier 230 is coupled to the input port 132 of the second analog-to-digital-converter. In other words, the analog-to-digital-converters 210 and 230 are in contrast to the embodiment according to FIG. 1A not directly coupled to the input port 102 (as in FIG. 1A) but indirect via the respective amplifiers 210 and 230. The first amplifier 210, the first analog-to-digital-converter 110 and the first transformation unit 120 form again a first signal path for providing a first digital frequency domain signal V1, and the second amplifier 230, the second analog-to-digital-converter 130, the second transformation unit 140 and the frequency response compensation unit 150 form the second signal path for providing the second digital frequency domain signal V2, respectively. One input port of the adder 222 is electrically coupled to the output port 224 of the first transformation unit and another input port of the adder 222 is coupled to the output port 154 of the frequency response compensation unit 150. The output port of the adder 222 is coupled to an input port of the divider 224 and an output port of the divider 224 is coupled to a third input port 175 of the selection unit 170.

The first amplifier 210 and the second amplifier 230 are, for example, drive amplifiers adapted to amplify the analog time domain signal v(t) before it is analog-to-digital-converted by the first and second analog-to-digital-converters 110 and 130. The first and second amplifier have preferably the same or at least similar amplification characteristics, and are, preferably, identical in construction. Although, for example, being identical in construction, both amplifiers typically show at least slightly different transfer characteristics or frequency responses due to, e.g., production variations.

Therefore, in certain embodiments the frequency response compensation unit 150 is not only adapted to compensate the differences between the first and second wanted signal components caused by the different frequency responses of the first and second analog-to-digital-converters, but also the differences between the first and second wanted signal components caused by the different frequency responses of the first and second amplifier. In general, the frequency response compensation unit 150 can be adapted to compensate, at least partically, the differences between the first and second wanted signal components caused by the different total or resulting frequency responses of the first and second signal path defined by the respective functional units contained in the first and second signal path.

Referring back to FIG. 2A, the first amplifier 210 is adapted to receive the analog time domain signal and to create a first amplified analog version of the analog time domain signal v(t). The second amplifier 230 is adapted to receive the same analog time domain input signal v(t) and to generate a second amplified version thereof, also referred to as second amplified analog time domain signal.

Like in FIG. 1A, the first analog-to-digital-converter 110 is adapted to receive the first analog time domain signal, in this case the first amplified analog time domain signal, and to generate a first digital time domain representation of the analog time domain signal, respectively, of the first amplified version of the analog time domain signal, also referred to as first digital frequency domain signal. Correspondingly, the second analog-to-digital-converter 130 is adapted to receive the second analog time domain signal, in this case the second amplified analog time domain signal, and to generate a second digital time domain representation of the analog time domain signal, respectively, of the second amplified version of the analog time domain signal, also referred to as second digital frequency domain signal.

Again like in FIG. 1A, the first transformation unit 120 is adapted to receive the first digital time domain signal, in this case being the digital representation of the first amplified analog time domain signal, and to generate a first spectral or frequency representation of the first digital time domain signal, also referred to as first digital frequency domain signal. The second transformation unit 140 is adapted to receive the second digital time domain signal, in this case being the digital representation of the second amplified analog time domain signal, and to perform a time-frequency transformation of the digital time domain signal to generate a second spectral or frequency representation of the second digital time domain signal, also referred to as second digital frequency domain signal.

As the total frequency response of the first amplifier and the first analog-to-digital-converter 110 is different to the total frequency response of the second amplifier 230 and the second analog-to-digital-converter 130, for example due to production variations, the frequency response compensation unit 150 of the second signal path is adapted to compensate the frequency response differences of the two signal paths. In other words, the frequency response compensation unit 150 is adapted to receive the second digital frequency domain signal and to correct or modify the second digital frequency domain signal based on a corrective frequency response. In other words, the frequency response compensation unit 150 generates based on the second digital frequency domain signal a corrected version thereof, which will be for simplicity reasons (like with regard to FIG. 1A) also referred to as second digital frequency domain signal V2. As in FIG. 1A, the first digital frequency domain signal V1 and the second digital frequency domain signal V2 are fed to the selection unit 170. In addition, the first and second frequency domain signals V1 and V2 are also fed to an adder 222 to generate a summed up frequency domain signal Vm comprising for each frequency bin a summed up frequency value of the frequency values V1(k) and V2(k) of the first and the second frequency domain signal V1 and V2. These summed up frequency values are than divided by 2 at the divider 224 to provide a mean frequency value Vm(k) for each frequency bin of the first and the second digital frequency domain signals V1 and V2. This mean or average frequency domain signal Vm is fed via the third input port 175 to the selection unit 170. In other words, the adder 222 and the divider 224 form together a means unit 222, 224 adapted to generate a mean digital frequency domain signal comprising the means values Vm(k) of the corresponding frequency values of the first and second digital frequency domain signals V1 and V2 for each bin k.

The comparison unit 160 of a further embodiment shown in FIG. 2A (similar to the one described based on FIG. 1A, see dotted lines, without the preprocessing block 240) is adapted to determine for each of the signals V1, V2 and Vm and the respective frequency bins the respective energy values based on the corresponding frequency values associated to the frequency bins, to compare for each frequency bin the energy values of the signals V1, V2 and Vm, and to determine the signal having the smallest or minimum energy value for each of the frequency bins. Similar to the apparatus 100 shown in FIG. 1A, the comparison unit 160 outputs, e.g. a selection signal 168 to the selection unit 170 indicating for each frequency bin k the frequency signal out of V1, V2, Vm having the smallest energy value.

Similar to FIG. 1A, the selection unit 170 is adapted to receive the first digital frequency domain signal V1, the second digital frequency domain signal V2 and the mean digital frequency domain signal Vm and to select for each frequency bin, based on the selection signal 168, the frequency value V1($k$), V2($k$) or Vm(k) having the smallest energy value.

Figure 2B:
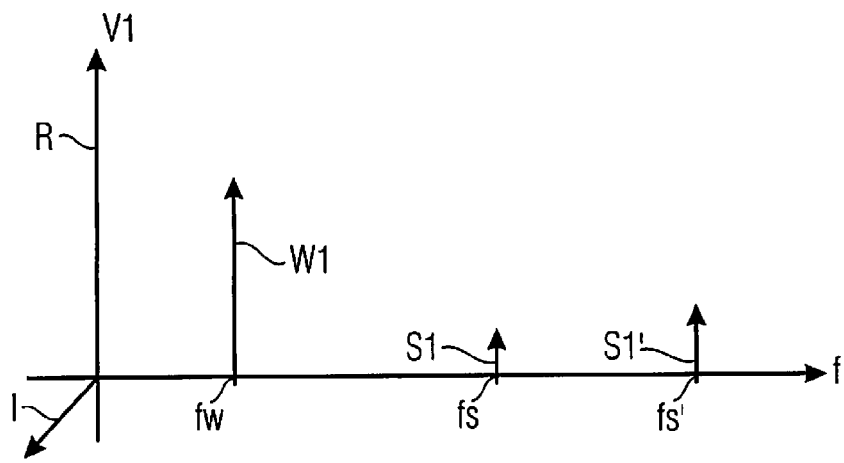
FIGS. 2B-2E show exemplarily first and second digital frequency domain signals, the resulting mean frequency domain values and the resulting digital frequency domain signal of the apparatus according to FIG. 2A after the minimum selection.
Figure 2C:
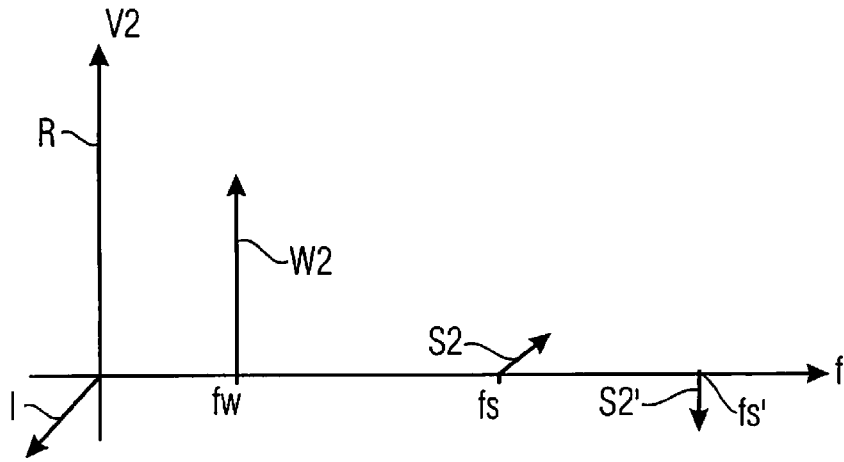
Figure 2D:
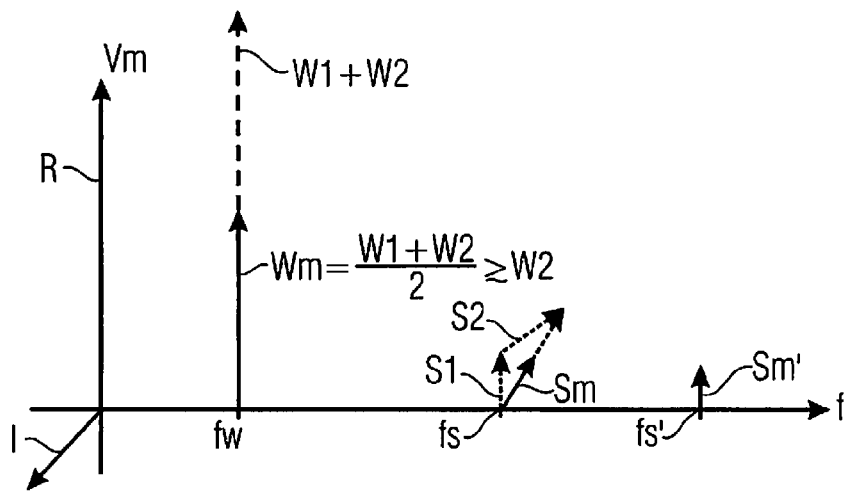

The operation of embodiments using additionally the mean values of the digital frequency domain signals will be explained in the following based on FIGS. 2B-2E. FIGS. 2B and 2C correspond to FIGS. 1B and 1C. In FIG. 2D the summed up values (complex pointer addition) are shown in broken lines, whereas the resulting mean value is shown as a continuous line (output of divider 284 after adder 282).

Figure 2E:
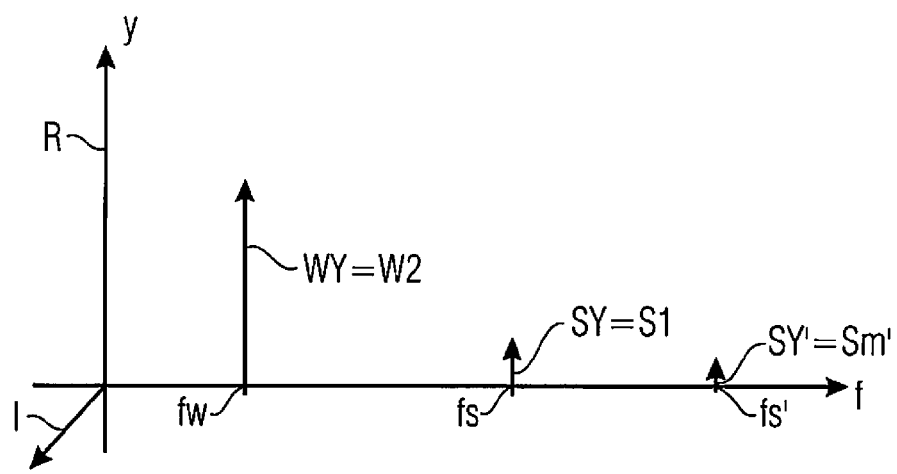

As can be seen from FIGS. 2B to 2D, the first wanted signal component W1 and the second wanted signal component W2 at bin fw are (after the frequency response compensation 150) in phase and comprise almost the same magnitudes. Therefore, the complex addition of the respective pointers corresponds to the addition of their magnitudes. Accordingly, the mean value Wm is approximately equal to the magnitudes of the first wanted signal component of W1 and the second wanted signal component W2. The differences are negligible. Assuming, just for illustrative purposes, that the second wanted signal component W2 is again (like in FIGS. 1B to 1D) slightly smaller than the first wanted signal component W1, the magnitude of Wm of the mean value is smaller than the magnitude of the first wanted signal component W1 but slightly larger than the magnitude of the second wanted signal component W2. Therefore, also the energy of the second digital frequency domain signal V2 for the frequency bin fw will be the smallest and selection unit 170 will select the frequency value Wm of the second digital frequency domain signal V2 as frequency value Y(k) for the output digital frequency domain signal Y, as shown in FIG. 2E. This loss compared to W1 is negligible.

With regard to the second frequency bin fs, the first adder 220 will sum up the first and second spurious signal components S1 and S2 by complex pointer addition (see broken lines in FIG. 2D), the magnitude of the resulting complex value Sm (half of the magnitude of the resulting pointer, see dotted lines) is larger than the magnitude of the first spurious signal S1 of the first digital frequency domain signal. Therefore the corresponding energy value of the first digital frequency domain signal S1 for frequency bin fs will be the smallest and the frequency value S1 will be selected as the frequency value Y(k=fs) for the output digital frequency domain signal Y, as shown in FIG. 2E.

As already explained based on FIGS. 1B and 1C, the spurious signal S1' of the first digital frequency domain signal at frequency bin fs' and the spurious signal S2' of the second frequency domain signal V2 have inverse directions or phases, and thus, at least partially cancel or extinct each other, as can be seen in FIG. 2D. As the magnitude of the spurious signal S1' is larger than the magnitude of the second spurious signal S2', the mean value determination generates a value Sm' in phase with the signal S1', however with a magnitude much smaller than the magnitude of the frequency value S1'. The magnitude of the mean value Sm' is also much smaller than the magnitude of the frequency value S2' of the second digital frequency domain signal V2. Based on the minimum energy decision performed by comparison unit 160 the mean value Sm' is used by the selection unit 170 as the corresponding frequency value Y(k=fs') for the respective frequency bin fs' of the output signal Y (see FIG. 2E).

Therefore, embodiments comprising means units 222, 224 facilitate to even further reduce spurious signals or spurious components, in particular, where spurious signal components of the first and second signal path cancel or at least partially cancel each other.

Furthermore, as the first noise components of the first digital frequency domain signal and the second noise components of the second digital frequency domain signal are not correlated, the corresponding powers are added. However, as the first wanted signal component of the first digital frequency domain signal and the second wanted signal component of the second digital frequency domain signal are correlated and in phase (no phase difference), the magnitudes are added. Therefore, the signal to noise ratio can already be increased by a factor of 2 (i.e. by 3 dB) by using the mean units.

In the following a second embodiment depicted in FIG. 2A will be described, the second embodiment comprising the preprocessing block 240 (dotted lines to be disregarded). In contrast to FIG. 1A and the first embodiment of FIG. 2A, the energy estimation of the comparison unit 160 is not performed based on the first and second digital frequency domain values V1($k$), V2($k$) or the respective mean frequency domain values Vm(k) but via a separate energy estimation preprocessing block 240 that is arranged parallel to the first and second signal path.

The energy estimation processing block 240 comprises a first windowing unit 250, a third transformation unit 255, a second windowing unit 260, a fourth transformation 265, a second frequency response compensation unit 270, a second adder 282 and a second divider 284.

An input port of the first windowing unit 250 is electrically coupled to the output port 114 of the first analog-to-digital-converter 110 and an output port of the first windowing unit 250 is coupled to an input port of the third transformation unit 255. An output port of the third transformation unit 255 is electrically coupled to the first input port 162 of the comparison unit 160. The first windowing unit 250 and the third transformation unit 255 form a first parallel signal path that is arranged parallel to, or at least partially parallel to the first signal path and are adapted to perform the preprocessing of the first digital time domain signal for the energy estimation.

An input port of the second windowing unit 260 is electrically coupled to the output port 134 of the second analog-to-digital-converter 130, an output port of the second windowing unit 260 is coupled to an input port of the fourth transformation unit 265 and an output port of the fourth transformation unit 265 is electrically coupled to an input port of the second frequency response compensation unit 270. An output port of the frequency response compensation unit 270 is electrically coupled to the second input port 264 of the comparison unit 160. The second windowing unit 260, the fourth transformation unit 265 and the second frequency response compensation unit 270 form a second parallel signal path arranged parallel to, or at least partially parallel to the second signal path.

The first input port of the second adder 282 is electrically coupled to the output port of the third transformation unit 255 and another input port of the second adder 282 is coupled to the output port of the second frequency response compensation unit 270. An output port of the adder 282 is coupled to an input port of the second divider 284, and an output port of the second divider is coupled to a third input port 165 of the comparator 160.

The first windowing unit 250 is adapted to receive the first digital time domain signal of the first signal path and to perform a window function on the first digital time domain signal to generate a parallel or windowed version of the first digital time domain signal. The third transformation unit 255 is adapted to receive the parallel version of the first digital time domain signal and to perform a time-frequency transformation of the latter to generate a spectral representation of the first parallel digital time domain signal. The spectral representation is also referred to as first parallel frequency domain signal V1' and is associated to the first digital frequency domain signal V1. The second windowing unit 260 is adapted to receive the second digital time domain signal from the second analog-to-digital-converter 130 and to perform a, preferably the same, windowing function on the latter to generate a parallel or windowed version of the second digital time domain signal, also referred to as second parallel digital time domain signal. The fourth transformation unit 265 is adapted to receive the second parallel digital time domain signal and to perform a time-frequency transformation to generate a spectral representation of the parallel second digital time domain signal, also referred to as second parallel digital frequency domain signal V2'. The third and fourth transformation units 255, 265 are preferably adapted to apply the same transformation algorithm like the first and second transformation units 120, 140. The second frequency response compensation unit 270 is adapted to receive the second parallel frequency domain signal output by the fourth transformation unit and to compensate—similar to the first compensation unit 150—differences in the frequency responses (caused, for example, by the first amplifier 210 and the first analog-to-digital-converter 110 on one hand and the second amplifier 230 and the second analog-to-digital-converter 130 on the other hand), to generate a frequency response compensated version of the second parallel digital frequency domain signal provided by the fourth transformation unit 265. For simplicity reasons the frequency response compensated version of the second parallel digital frequency domain signal will also be referred to as second parallel digital frequency domain signal V2'. The second frequency response compensation unit 270 can be adapted to apply the same frequency correction or compensation function as the (first) frequency response compensation unit 150. The parallel digital frequency domain signals V1' and V2' are fed to the comparison unit 160. Additionally, the signals V1' and V2' are added by the second adder 282 and the added or summed up signal is divided by second divider 284 to determine a parallel mean frequency value Vm' for each bin k. In other words, the adder 282 and the divider 284 form a parallel means unit 282, 284 adapted to determine a parallel mean frequency signal comprising for each frequency bin k the mean values Vm'(k) of the parallel frequency domain signal V1' and V2'. The digital frequency domain signal Vm' is fed to the comparison unit 160 via the third port 165.

The comparison unit 160 according to FIG. 2A is adapted to determine for each of the signals V1', V2' and Vm' and the respective frequency bins the respective energy values (corresponding first parallel, second parallel and mean parallel energy values as first, second and mean energy values associated to the first, second and mean frequency values V1($k$), V2($k$), Vm(k)) based on the corresponding parallel frequency values associated to the frequency bins, and to compare for each frequency bin the energy values of the signals V1', V2' and Vm', and to determine the signal having the smallest or minimum energy value for each of the frequency bins. Like the aforementioned first embodiment depicted in FIG. 2A, the comparison unit 160 outputs a selection signal 168 to the selection unit 170 indicating for each frequency bin k the signal out of V1', V2' and Vm' having the smallest energy value.

The selection unit 170 is adapted to receive the first digital frequency domain signal V1, the second digital frequency domain signal V2 and the mean digital frequency domain signal Vm and to select for each frequency bin, based on the selection signal 168, the frequency value corresponding to the smallest energy value.

In other words, the second embodiment differs from the first embodiment in that the comparison unit 160 does not use the digital frequency domain signals themselves for the energy estimation but digital frequency domain signals derived from these or the corresponding digital time domain signals. The minimum selection process itself is the same. Therefore, the explanations with regard to FIGS. 2B to 2E also apply for the second embodiment except that the parallel frequency values V1', V2' and optionally Vm' and their corresponding energy values are used instead of the frequency values V1, V2 and optionally Vm.

The first and second windowing unit 250 and 260 can be adapted to, for example, apply a windowing function using, for example, a Hamming window, Hann window or a Blackman-Harris window to reduce the leakage effect and to increase the processing gain.

The analog input signal v(t) can, for example, be an intermediate frequency signal of a receiver or radio signals in a baseband. As shown in FIG. 2A the analog input signal v(t) is fed to analog sections, for example amplifiers 210 and 230 adapted to drive the analog-to-digital-converters 110 and 130. Preferably the power amplifiers 210 and 230 are identical circuits, i.e. circuits having the same or at least similar amplification characteristics and/or are, for example, identical in construction. The analog-to-digital-converters 110 and 130 provide digital representations of the analog input signal and the subsequent processing is done in the spectral domain, i.e. frequency domain. The transformation units transform the digital time domain signal into the spectral domain, typically with overlap, using, for example, Fast Fourier transformation (FFT), Discrete Fourier Transformation (DFT) or other time-to-frequency transformation algorithms.

The input stages, for example amplifiers 210 and 230, and the analog-to-digital-converters 110 and 130 typically have slight differences in their frequency response and their delay (group delay) so one path, in FIGS. 1A and 2A the second path, is subject to a frequency response correction 150. This frequency response correction can be easily performed in the spectral domain by multiplying a complex vector or pointer representing the inverted difference in the frequency responses between the first path (210, 110) and the second path (230, 130).

Although FIGS. 1A and 2A show embodiments of the apparatus, wherein the frequency response compensation is performed after the time to spectrum transformation, other embodiments may comprise frequency response compensation units arranged before the transformation unit 140, for example between the analog-to-digital-converter 130 and the transformation unit 140.

Embodiments according to FIG. 2A generate three representations of the analog input signal v(t). The first digital frequency domain signal V1 output by the first transformation unit 120 representing the input signal v(t) plus a noise component n_a(t) and intermodulation components or spurious components s_a(t) generated by stages 210 and 110. The second digital frequency domain signal V2 output by the frequency response compensation unit 150 representing the input signal v(t) plus a noise component n_b(t) and intermodulation components or spurious components s_b(t) generated by stages 230 and 130. In addition, for example, the arithmetic mean representation Vm of the first and second digital frequency domain signal V1 and V2 is generated.

The noise components n_a(t) and n_b(t) are typically uncorrelated, and the spurious signal components s_a(t) and s_b(t) are usually partially correlated. The signal v(t) being perfectly correlated in the first and second digital frequency domain signals V1 and V2 due to the frequency response correction 150, the mean signal Vm will exhibit 3 dB increased signal to noise ratio compared to the first and second digital frequency domain signals V1 and V2. As s_a(t) and s_b(t) vary in intensity and are partially correlated, the mean digital frequency domain signal Vm has spurious signals or spurious signal components typically not higher than those contained in the first and second digital frequency domain signals V1 or V2 but normally higher than the minimum of the spurious signals contained in the first and second digital frequency domain signals V1 and V2. For each frequency bin k, embodiments of the present invention now select the bin with the lowest energy or power out of V1(k), V2(k) and optionally Vm(k) to be used as the element or value of the output signal Y(k). The comparison and selection is done in stages 160 and 170.

In preferred embodiments, as shown in FIG. 2A (second embodiment), the estimation of the energies in each bin k can best be performed in a separate block 240 by performing the time-spectrum transformation, for example, via FFT, after applying a window function (see windowing units 250, 260).

Alternatively, the frequency domain signals V1, V2 and Vm can be directly used for the estimation of the energies (first embodiment, see dotted lines in FIG. 2A connecting the output port 124 of the first transformation unit with the first input port 162 of a comparison unit, connecting the output port 154 of the frequency response compensation unit 150 with the second port 164 of the comparison unit and electrically coupling the output port of the divider 224 or means unit with the third input port 165 of the comparison unit). This reduces the amount of digital processing power and digital processing elements required (no preprocessing block 240 required), but may degrade the effectivity of the spurious signal and noise reduction. Such embodiments are similar to the one described based on FIG. 1A except that they comprise the means unit 222 and 224 to provide mean frequency values for the energy estimation and for the output values Y(k).

In further embodiments without the preprocessing block 240, the windowing units 250 and 260 may be integrated into the first and second signal path, for example the first windowing unit 250 between the first analog-to-digital-converter 110 and the first transformation unit 120, and the second windowing unit 260 between the second analog-to-digital-converter 130 and the second transformation unit 140. Such embodiments also allow to reduce the amount of digital processing power and digital processing elements required. In contrast to embodiments comprising the additional preprocessing block 240, the wanted signal itself and the corresponding spectral representation in the frequency domain is windowed.

In an even further embodiment, the windowing function in the time domain of the windowing units 250 and 260 is instead provided by means of a convolution in the frequency domain, which allows to use the output signals V1, V2 of the first and second signal path and eliminates the need for separate transformation units 255 and 265 and separate frequency response compensation units 270. This kind of preprocessing block only comprises a first and a second convolution means coupled between the first and second signal path and the corresponding input ports of the comparer 160 (i.e. could be coupled between the connection depicted by the dotted lines in FIG. 2A).

Further embodiments according to FIG. 1A may comprise further signal paths, which would result in a further reduction of the spurious signals and noise and then increase a performance. This is shown in broken lines in FIG. 1A. The third or any further additional signal path has typically the same elements and structure as the second signal path, i.e. a further analog-to-digital-converter 130' adapted to receive, e.g. the same analog time domain signal and to convert the analog input signal into a further digital time domain signal, a further transformation unit 140' adapted to receive the further digital time domain signal and to transform the same into a corresponding further digital frequency domain signal, and a further frequency response compensation unit 150' adapted to receive the further digital frequency domain signal of the further transformation unit and to compensate or correct the difference in phase response and delay between the first signal path and the third or further signal path. The comparison unit 160 would be adapted to receive the first, the second and the third or any further digital frequency domain signal representation of the analog input signal v(t), to estimate for each frequency bin k of each of the different signals the corresponding energy values and to determine for each of the frequency bins k the digital frequency domain signal with the lowest energy to select in selection unit 170 the respective frequency value for the respective frequency bin k of the output signal Y(k).

Further signal paths may also be added to embodiments according to FIG. 2A in a similar manner as described for FIG. 1A. Such embodiments would, for example, comprise additional amplifiers (optional for all signal paths) in front of the analog-to-digital-converters and comprise one or several means units to determine the mean signals to the corresponding original signals V1, V2, V3, and so on. The means units can be adapted to, for example, determine one or all of the possible mean values of the three digital frequency domain signals V1, V2 and V3, for example, Vm12 (arithmetic mean of signals V1 and V2), Vm13 (arithmetic mean of signals V1 and V3), Vm23 (arithmetic mean of signals V2 and V3) and/or Vm123 (arithmetic mean of signals V1, V2 and V3). Thus, in a matrix like manner mean values of the different combinations of the original frequency domain signal representations of the analog signal can be determined and used for the minimum energy selection process.

FIGS. 3A to 3F show graphs derived from actual data captured from two high performance analog-to-digital-converters operating at 320 MHz sampling rate and fed with a sine signal at 15.5 MHz. The sine signal has a second harmonic component and 31 MHz and an observable phase noise pedestal.

Figure 3A:
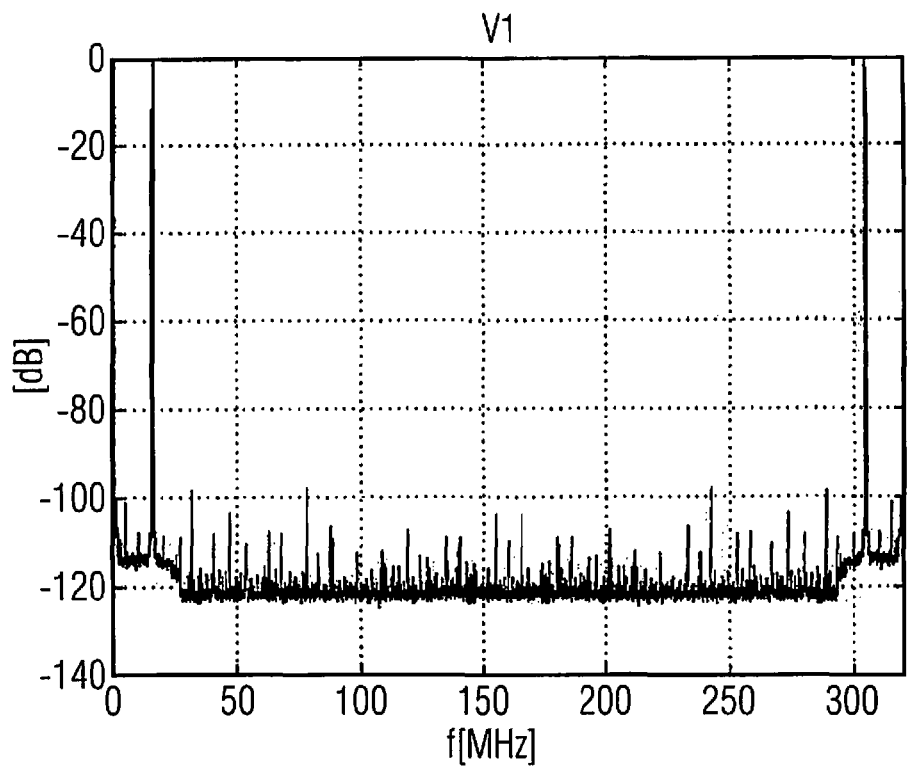
FIG. 3A-3F show graphs of actual data for an embodiment of an apparatus according to FIG. 2A.

FIG. 3A shows the signal to noise ratio, to be more precise, the wanted signal component to spurious signal component ratio and the wanted signal component to noise component ratio in dB (y-axis) for the different frequency bins of the first frequency domain signal V1, the frequency range covering frequency bins k from 0 MHz to 320 MHz.

Figure 3B:
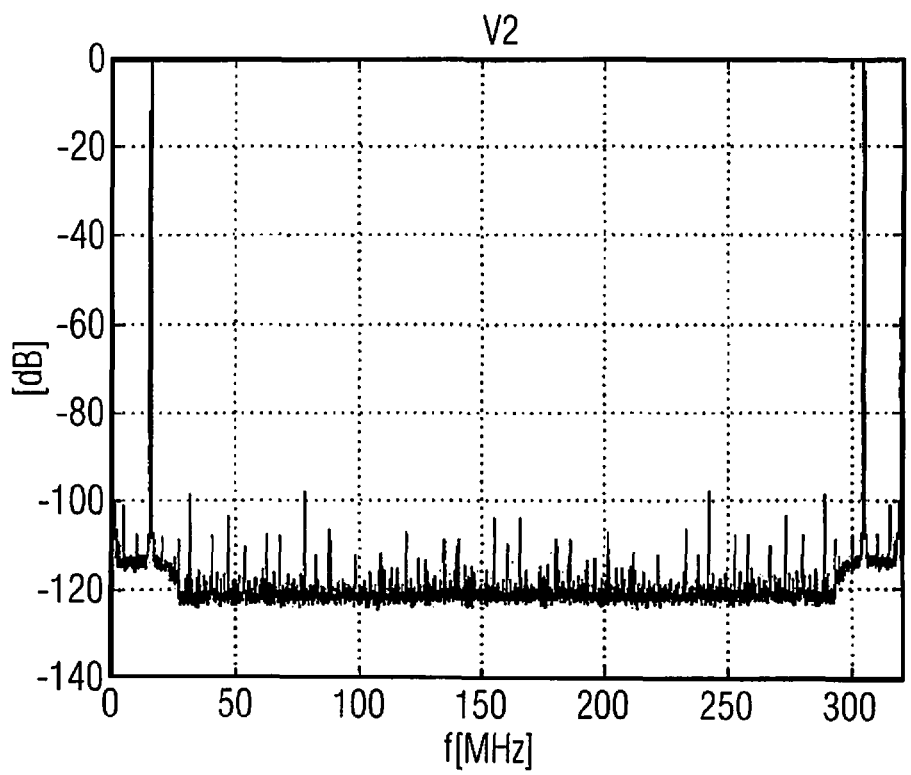

FIG. 3B shows a similar diagram as FIG. 3A for the second digital frequency domain signal V2 as, e.g. output by the frequency compensation unit 150.

Figure 3C:
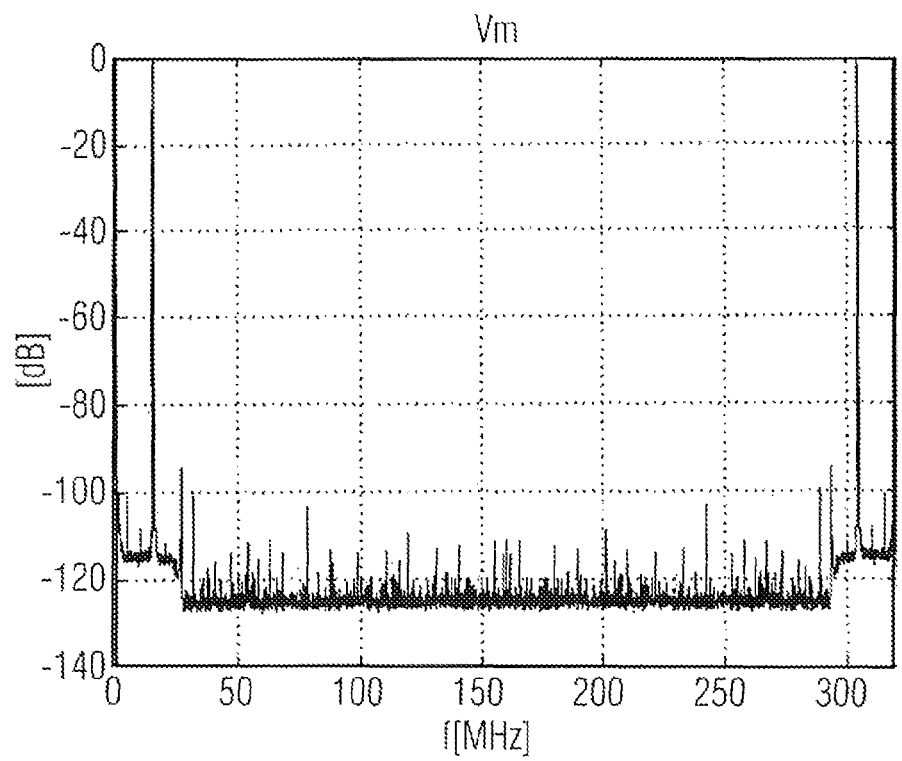

FIG. 3C shows the corresponding diagram for the means frequency domain signal Vm produced by the means unit 222, 224. As can be seen when comparing the FIG. 3A with FIG. 3C and FIG. 3B with FIG. 3C, the means frequency domain signal Vm exhibits already a 3 dB increased signal to noise ratio compared to V1 and V2. In addition, the signal to spurious ratio is also improved for some frequency bins (FIG. 3C shows no frequency values "below" −100 dB in the frequency range from 50 MHz to 250 MHz).

Figure 3D:
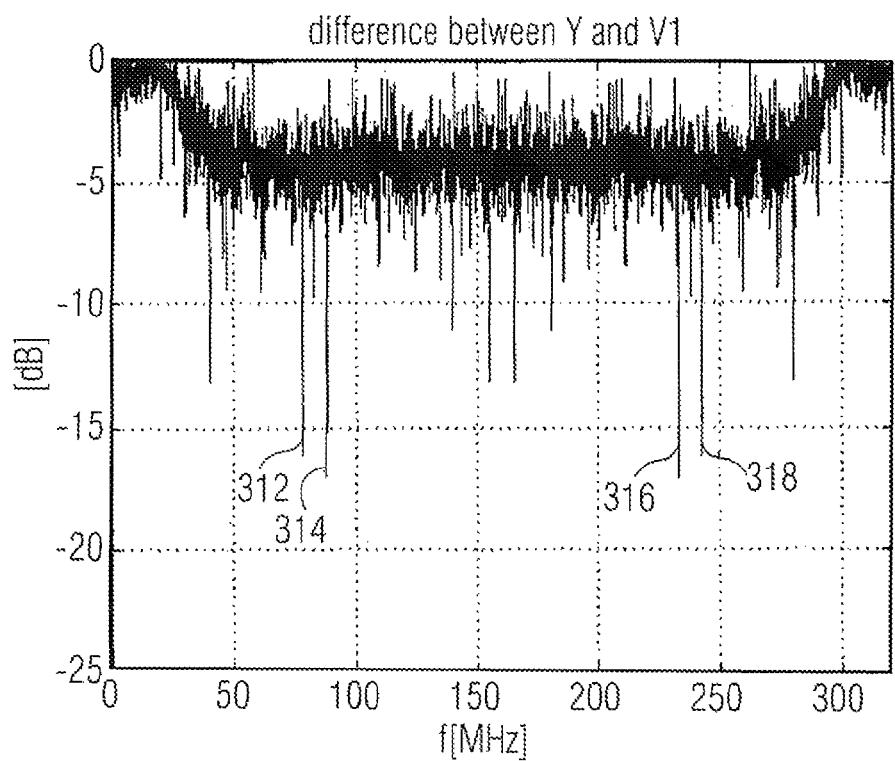
Figure 3E:
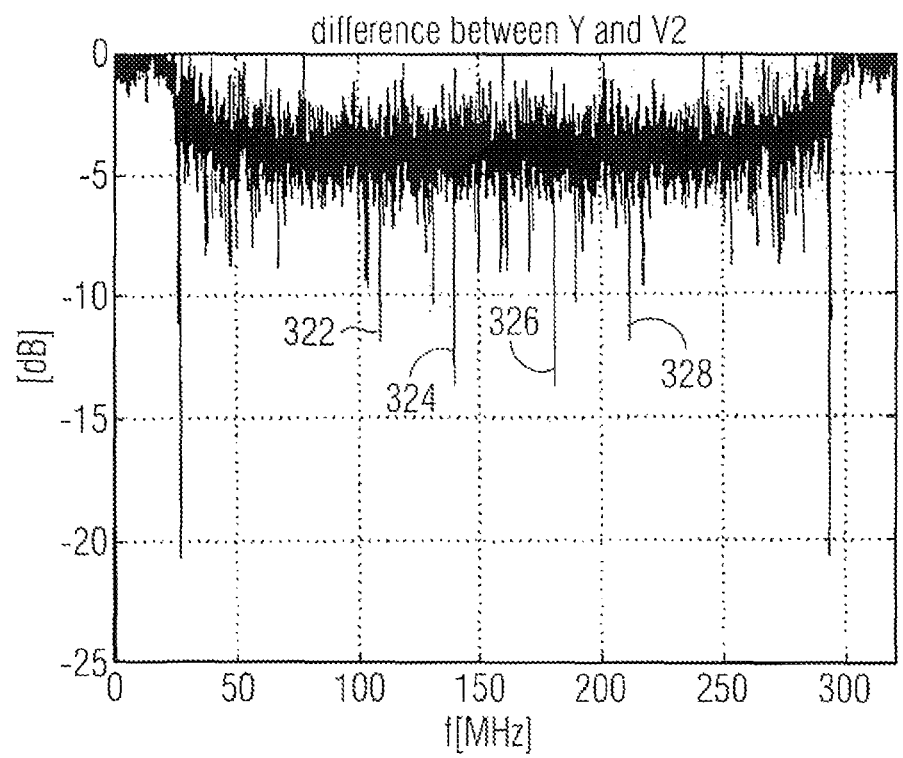

FIG. 3D shows a comparison of spectrum or output frequency domain signal Y compared to spectrum or first frequency domain signal V1, and FIG. 3E shows a comparison diagram comparing spectrum or output frequency domain signal Y with spectrum or first frequency domain signal V2, wherein in both diagrams a negative difference in dB indicates an improvement in performance.

Reference sign 312 to 318 show exemplary gains of more than 15 dB compared to V1 and reference signs 322 to 328 show exemplary gains of more than 10 dB compared to V2 due to spurious reduction accomplished by the aforementioned embodiments. Reference signs 312, 314, 316 and 318 refer to exemplary spurious signal components.

Figure 3F:
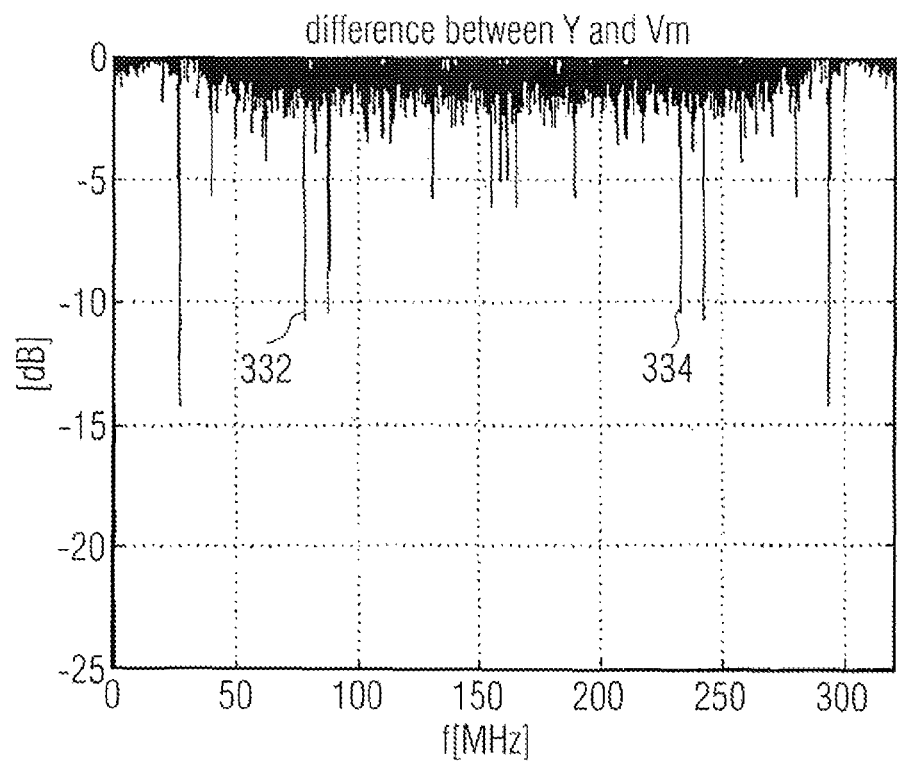

FIG. 3F shows a diagram comparing the spectrum Y and the mean value spectrum Vm, wherein again a negative difference indicates an improvement in performance. As can be seen from the diagrams, the use of means values already improves the performance by approximately 3 dB, however, using the minimum energy selection criterion the signal to noise ratio can be even further improved by 1 to 2 dB, as shown in FIG. 3F. Furthermore, FIG. 3F also shows the performance gain of more than 10 dB, for example for the frequency bins with the spurious signals 332 and 334. Looking at FIGS. 3D and 3E, it can be further seen that applying the aforementioned minimum energy selection criterion the signal to noise ratio has been improved by approximately 6 dB compared to conventional single analog-to-digital-converters. It can also be seen from the Figures that the phase noise and the harmonic of the input at 31 MHz are not affected by the minimum energy criterion as expected.

To summarize the aforementioned, embodiments of the present invention make use of the effect that spurious signals caused by analog-to-digital-converters when converting analog input signals into digital signals are typically not correlated or only partly correlated. The lower the degree of correlation, the higher are the possible performance gains achievable by embodiments of the present invention.

In addition, the minimum energy selection criterion applied by embodiments of the present invention also improves the noise performance.

Although embodiments of apparatus and methods for converting an analog time domain signal into a digital frequency domain signal have been described, wherein, for example, the first and second analog-to-digital-converters 110, 130 are both directly coupled to the input port 102 or indirect (via first and second amplifiers 210, 230) to receive the analog time domain signal v(t), and the first and second transformation units 120, 140 are directly coupled to the respective first and second analog-to-digital-converter 110, 130, in other embodiments, further elements may be coupled between these and the other functional units or elements described above, as required for the specific application of the embodiments for analog-to-digital-conversion. Preferably the first and the second signal path (or the further signal paths) comprise the same functional units at the same positions within the respective signal paths or at least functional elements with similar functionality and characteristics so as to keep the difference between the wanted signal components of the first and second (and the further) signal paths small, preferably so small they can be neglected. In addition and/or instead the frequency response compensation unit (further frequency response compensation unit) of the second signal path (or of the further signal paths) is adapted such that it reduces at least the differences between the corresponding wanted signal components of the first and second (and further) signal paths, and preferably reduces these differences to such an extent that they can be neglected for the purposes of the aforementioned minimum energy selection. In addition, at embodiments employing a preprocessing block or similar means, the first and second parallel signal paths (or the further parallel signal paths) comprise the same functional units at the same positions within the respective parallel signal paths or at least functional elements with similar functionality and characteristics so as to keep the difference between the wanted signal components of the first and second (and the further) parallel signal paths small, preferably so small they can be neglected. In addition and/or instead the frequency response compensation unit (further frequency response compensation unit) of the second parallel signal path (or of the further parallel signal paths) is adapted such that it reduces at least the differences between the corresponding wanted signal components of the first and second (and further) parallel signal paths, and preferrably reduces these differences to such an extent that they can be neglected for the purposes of the aforementioned minimum energy selection.

In general, embodiments of the comparison unit 160 are adapted to determine for the same frequency bin k a corresponding first energy value associated to the first frequency value V1(k), a corresponding second energy value associated to the second frequency value V2(k), and—optionally a corresponding third (or further) energy value associated to the third (or further) frequency value V3(k) and/or one or more a corresponding mean energy values associated to the corresponding to the one or more mean energy values, to compare these energy values for the same frequency bin k, and to determine a minimum energy value thereof. These energy values can be derived from the frequency values V1(k), V2(k), Vm(k), etc directly or based on other further processed versions of, e.g. the first, second or further digital representations (time domain or frequency domain) of the analog signal as described with regard to FIG. 2A. In other words, the comparison unit 160 can be adapted to determine for the same frequency bin k a corresponding first energy value associated to the first frequency value (V1(k) based on the first frequency value V1(k) or another processed version of the first digital domain signal, and a corresponding second energy value associated to the second frequency value (V2(k) based on the second frequency value V2(k) or another processed version of the second digital domain signal. The same applies for the other optional frequency values that may be used in embodiment of the present invention.

According to a further aspect of the present invention, an apparatus for converting an analog time domain signal into a digital time domain signal is provided, the apparatus comprising an apparatus for converting an analog time domain signal into a digital frequency domain signal as described above (FIGS. 1A to 3G) and additionally an inverse transformation unit coupled to the output port 104 of the apparatus for converting an analog time domain signal into a digital frequency domain signal to retransform the frequency domain representation of the analog signal v(t) into a digital time domain representation. The inverse transformation unit is adapted to perform an inverse transformation, for example an inverse discrete Fourier transformation or an inverse fast Fourier transformation (IDFT, IFFT), the term "inverse" referring to the corresponding transformation algorithm used by the first and second transformation units 120 and 140.

According to even further aspects of the present invention, other embodiments of the present invention provide the corresponding methods for converting an analog time domain signal into a digital frequency domain signal and/or for converting an analog time domain signal into a digital time domain signal.

Depending on certain implementation requirements of the inventive methods, the inventive methods can be implemented in hardware or in software. The implementation can be performed using a digital storage medium, in particular, a disc, a CD or a DVD having an electronically readable control signal stored thereon which cooperates with a programmable computer system such that an embodiment of the inventive methods is performed. Generally, an embodiment of the present invention is, therefore, a computer program produce with a program code stored on a machine-readable carrier, the program code being operative for performing the inventive methods when the computer program product runs on a computer. In other words, embodiments of the inventive methods are therefore, a computer program having a program code for performing at least one of the inventive methods when the computer program runs on a computer. Embodiments can also be implemented as field programmable gate arrays (FPGA) or similar technologies While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus for converting an analog time domain signal into a digital frequency domain signal, the apparatus comprising:
   a first analog-to-digital-converter adapted to receive the analog time domain signal and to convert the analog time domain signal into a first digital time domain signal according to a first frequency response;
   a second analog-to-digital-converter identical in construction to the first analog-to-digital-converter, wherein the second analog-to-digital-converter is adapted to receive the analog time domain signal and to convert the analog time domain signal into a second digital time domain signal according to a second frequency response, the second frequency response differing from the first frequency response;
   a first transformation unit adapted to transform the first digital time domain signal into a first digital frequency domain signal, wherein the first digital frequency domain signal comprises for a frequency bin of the first digital frequency domain signal a corresponding first frequency value, wherein the first frequency value comprises a first wanted signal component, a first spurious signal component and/or a first noise component, the first spurious signal component and/or the first noise component at least partially being caused by the first analog-to-digital-converter;
   a second transformation unit adapted to transform the second digital time domain signal into a second frequency domain signal, wherein the second digital frequency domain signal comprises for a same frequency bin of the second digital frequency domain signal a corresponding second frequency value, wherein the second frequency value comprises a second wanted signal component, a second spurious signal component and/or a second noise component, wherein the second spurious signal component and/or the second noise component are at least partially caused by the second analog-to-digital-converter, and wherein the second spurious signal component differs from the first spurious signal component and/or the second noise component differs from the first noise component;
   a frequency compensation unit adapted to modify the second frequency signal so as to reduce a difference between the second wanted signal component of the second frequency value and the first wanted signal component of the first frequency value caused at least partially by the difference between the second frequency response and the first frequency response;
   a comparison unit adapted to determine for the same frequency bin a corresponding first energy value associated to the first frequency value and a corresponding second energy value associated to the second frequency value, to compare the first energy value and the second energy value, and to determine a minimum energy value thereof; and
   a selection unit adapted to select for a same bin of the digital frequency domain signal of the apparatus the corresponding first frequency value in case the corresponding first energy value is the minimum energy value, or the corresponding second frequency value in case the corresponding second energy value is the minimum energy value.

2. The apparatus according to claim 1 further comprising:
   a means unit adapted to determine for the same frequency bin a mean frequency value based on the corresponding first frequency value and the corresponding second frequency value;
   wherein the comparison unit is further adapted to determine for the same frequency bin a corresponding mean energy value associated to the mean frequency value and to determine the minimum energy value out of the first energy value, the second energy value and the mean energy value; and
   wherein the selection unit is further adapted to select the corresponding mean value as frequency value for the bin of the digital frequency domain signal of the apparatus in case the corresponding mean energy value is the minimum energy value.

3. The apparatus according to claim 2, comprising:
   a first windowing unit adapted to apply a window function to the first digital time domain signal to generate a first parallel digital time domain signal;
   a second windowing unit adapted to apply a window function to the second digital time domain signal to generate a second parallel digital time domain signal;
   a first parallel transformation unit adapted to transform the first parallel digital time domain signal into a first parallel digital frequency domain signal, wherein the first parallel digital frequency domain signal comprises for a same frequency bin of the parallel first digital frequency domain signal a corresponding first parallel frequency value, wherein the parallel first frequency value comprises a first parallel wanted signal component, a first parallel spurious signal component and/or a first parallel noise component, the first parallel spurious signal component and/or the first parallel noise component at least partially being caused by the first analog-to-digital-converter
   a second parallel transformation unit adapted to transform the second digital time domain signal into a second parallel frequency domain signal, wherein the second parallel digital frequency domain signal comprises for a same frequency bin of the parallel second digital frequency domain signal a corresponding second parallel frequency value, wherein the second parallel frequency value comprises a second parallel wanted signal component, a second parallel spurious signal component and/or a second parallel noise component, wherein the second parallel spurious signal component and/or the second parallel noise component are at least partially caused by the second analog-to-digital-converter, and wherein the second parallel spurious signal component differs from the first parallel spurious signal component and/or the second parallel noise component differs from the first parallel noise component;

a parallel frequency compensation unit adapted to modify the second parallel frequency signal so as to reduce a difference between the second parallel wanted signal component of the second parallel frequency value and the first parallel wanted signal component of the first parallel frequency value caused by the difference between the second frequency response and the first frequency response;

wherein the comparison unit is adapted to determine for the same frequency bin the corresponding first energy value associated to the first digital frequency domain signal based on the parallel first frequency value and the corresponding second energy value associated to the second digital frequency domain signal based on the second parallel frequency value.

4. The apparatus according to claim 3, comprising:
a parallel means unit adapted to determine for the same frequency bin a mean parallel frequency value based on the corresponding first parallel frequency value and the corresponding second parallel frequency value;

wherein the comparison unit is further adapted to determine for the same frequency bin the corresponding mean energy value associated to the mean frequency value based on the mean parallel frequency value.

5. The apparatus according to claim 1, further comprising:
a third analog-to-digital-converter identical in construction to the first analog-to-digital-converter, wherein the third analog-to-digital-converter is adapted to receive the analog time domain signal and to convert the analog time domain signal into a third digital time domain signal according to a third frequency response, the third frequency response differing from the first frequency response;

a third transformation unit adapted to transform the third digital time domain signal into a third frequency domain signal, wherein the third digital frequency domain signal comprises for a same frequency bin of the third digital frequency domain signal a corresponding third frequency value, wherein the third frequency value comprises a third wanted signal component, a third spurious signal component and/or a third noise component, wherein the third spurious signal component and/or the third noise component are at least partially caused by the third analog-to-digital-converter, and wherein the third spurious signal component differs from the first spurious signal component and/or the third noise component differs from the first noise component;

a second frequency compensation unit adapted to modify the third frequency signal so as to reduce a difference between the third wanted signal component of the third frequency value and the first wanted signal component of the first frequency value caused by the difference between the third frequency response and the first frequency response;

wherein the comparison unit is further adapted to determine for the same frequency bin a corresponding third energy value associated to the third frequency value, and to compare the first energy value, the second energy value and the third energy value to determine a minimum energy value thereof;

wherein the selection unit is further adapted to select for the same bin of the digital frequency domain signal of the apparatus the corresponding third frequency value in case the corresponding third energy value is the minimum energy value.

6. The apparatus according to claim 5, further comprising:
a means unit adapted to determine for the same frequency bin a first mean frequency value based on the corresponding first frequency value and the corresponding second frequency value, a second mean frequency value based on the corresponding first frequency value and the corresponding third frequency value, a third mean frequency value based on the corresponding second frequency value and the corresponding third frequency value, and/or a fourth mean frequency value based on the corresponding first frequency value, the corresponding second frequency value and the corresponding third frequency value;

wherein the comparison unit is further adapted to determine for the frequency bin a corresponding first mean energy value associated to the first mean frequency value, a corresponding second mean energy value associated to the second mean frequency value, a corresponding third mean energy value associated to the third mean frequency value and a corresponding fourth mean energy value associated to the fourth mean frequency value, and to determine the minimum energy value out of the first energy value, the second energy value, the third energy value and at least one mean energy value out of the first energy value, the second energy value, the third energy value and the fourth energy value; and wherein the selection unit is further adapted to select for the same bin of the digital frequency domain signal of the apparatus the corresponding first mean value as frequency value in case the corresponding first mean energy value is the minimum energy value, the corresponding second mean value as frequency value in case the corresponding second mean energy value is the minimum energy value, the corresponding third mean value as frequency value in case the corresponding third mean energy value is the minimum energy value and/or the corresponding fourth mean value as frequency value in case the corresponding fourth mean energy value is the minimum energy value.

7. The apparatus according to claim 1, wherein the comparison unit is adapted to determine the corresponding first energy value associated to the first frequency value based on the second frequency value and the corresponding second energy value associated to the second frequency value based on the second digital frequency domain signal.

8. The apparatus according to claim 1, the apparatus further comprising:
a first windowing unit adapted to apply a window function to the first digital time domain signal before the first digital time domain signal is transformed to the first digital frequency domain signal; and a second windowing unit adapted to apply a window function to the second digital time domain signal before the second time domain digital signal is transformed to the second digital frequency domain signal.

9. The apparatus according to claim 1, the apparatus further comprising;
  a first windowing unit adapted to perform a convolution of the first digital frequency domain signal with a frequency domain representation of a window function before the first energy value associated to the first frequency domain signal is determined; and
  a second windowing unit adapted to perform a convolution of the second digital frequency domain signal with the frequency domain representation of a window function before the second energy value associated to the second frequency domain signal is determined.

10. The apparatus according to claim 1, wherein the first and second transformation unit are adapted to use a Discrete Fourier Transform (DFT) or Fast Fourier Transform (FFT) to transform the first digital time domain signal into the first digital frequency domain signal and the second digital time domain signal into the second digital frequency domain signal.

11. The apparatus according to claim 1, wherein the frequency response compensation unit is adapted to modify the second digital frequency domain signal by multiplying the second digital frequency domain signal with a complex vector representing an inversion of the difference between the first frequency response and the second frequency response.

12. The apparatus according to claim 1, further comprising:
  a first amplifier connected in front of the first analog-to-digital converter and adapted to amplify the analog time domain signal according to a first amplification frequency response before the analog time domain signal is converted by the first analog-to-digital converter; and
  a second amplifier connected in front of the second analog-to-digital converter and adapted to amplify the second analog time domain signal according to a second amplification frequency response before the analog time domain signal is converted by the second analog-to-digital converter, wherein the second amplification response is different to the first amplification response;
  wherein, the first spurious signal component and/or the first noise component of the first frequency value are at least partially caused by the first analog-to-digital-converter and the first amplifier;
  wherein the second spurious signal component and/or the second noise component of the second frequency value are at least partially caused by the second analog-to-digital-converter and the second amplifier; and
  wherein the frequency compensation unit is adapted to modify the second frequency signal so as to reduce a difference between the second wanted signal component of the second frequency value and the first wanted signal component of the first frequency value caused at least partially by the difference between the second amplification frequency response and the first amplification frequency response and by the difference between the first amplification response and the second amplification response.

13. An apparatus for converting an analog time domain signal into a digital time domain signal, comprising:
  an apparatus for converting an analog time domain signal into digital frequency domain signal according to one of the claims 1 to 12; and
  an inverse transformation unit adapted to transform the digital frequency domain signal into the digital time domain signal.

14. The apparatus according to claim 1, wherein the apparatus is a wide band digital receiver and the analog time domain signal is a wide band analog signal.

15. A method for converting an analog time domain signal into a digital frequency domain signal, the method comprising:
  receiving the analog time domain signal;
  converting the analog time domain signal into a first digital time domain signal by a first analog-to-digital-converter according to a first frequency response;
  converting the analog time domain signal into a second digital time domain signal by a second analog-to-digital-converter identical in construction to the first analog-to-digital-converter according to a second frequency response, the second frequency response differing from the first frequency response;
  transforming the first digital time domain signal into a first digital frequency domain signal, wherein the first digital frequency domain signal comprises for a frequency bin of the first digital frequency domain signal a corresponding first frequency value, wherein the first frequency value comprises a first wanted signal component, a first spurious signal component and/or a first noise component, the first spurious signal component and/or the first noise component at least partially being caused by the first analog-to-digital-converter;
  transforming the second digital time domain signal into a second frequency domain signal, wherein the second digital frequency domain signal comprises for the same frequency bin of the second digital frequency domain signal a corresponding second frequency value, wherein the second frequency value comprises a second wanted signal component, a second spurious signal component and/or a second noise component, wherein the second spurious signal component and/or the second noise component are at least partially caused by the second analog-to-digital-converter, and wherein the second spurious signal component differs from the first spurious signal component and/or the second noise component differs from the first noise component;
  modifying the second frequency signal so as to reduce a difference between the second wanted signal component of the second frequency value and the first wanted signal component of the first frequency value caused at least partially by the difference between the second frequency response and the first frequency response;
  determining for the same frequency bin a corresponding first energy value associated to the first digital frequency value and a corresponding second energy value associated to the second frequency value;
  comparing the first energy value and the second energy value to determine a minimum energy value thereof; and
  selecting for the same bin of the digital frequency domain signal of the apparatus the corresponding first frequency value in case the corresponding first energy value is the minimum energy value, or the corresponding second frequency value in case the corresponding second energy value is the minimum energy value.

16. A method for converting an analog time domain signal into a digital time domain signal, the method comprising:
  converting an analog time domain signal into a digital frequency domain signal according to claim 15, and
  inverse transforming the digital frequency domain signal into the digital time domain signal.

17. A non-transient computer program product comprising a program code for performing a method in accordance with claim 15 or 16, when the program runs on a computer.

* * * * *